(12) United States Patent
Baiza

(10) Patent No.: US 7,258,583 B1
(45) Date of Patent: Aug. 21, 2007

(54) CABLE MANAGEMENT ARM HAVING CABLE RETENTION MEMBERS

(75) Inventor: Julian S. Baiza, Arlington, TX (US)

(73) Assignee: Central Industrial Supply Company, Grand Prairie, TX (US)

( * ) Notice: Subject to any disclaimer, the term of this patent is extended or adjusted under 35 U.S.C. 154(b) by 0 days.

(21) Appl. No.: 11/343,904

(22) Filed: Jan. 31, 2006

Related U.S. Application Data

(60) Provisional application No. 60/648,528, filed on Jan. 31, 2005.

(51) Int. Cl.
*H01R 9/22* (2006.01)

(52) U.S. Cl. .................................. 439/719; 174/72 A

(58) Field of Classification Search ............... 439/719; 211/26; 174/72 A
See application file for complete search history.

(56) References Cited

U.S. PATENT DOCUMENTS

| 919,777 | A | | 4/1909 | Savin et al. | |
|---|---|---|---|---|---|
| 1,636,366 | A | | 7/1927 | Hubener | |
| 3,120,411 | A | | 2/1964 | Strumpell | |
| 3,968,322 | A | * | 7/1976 | Taylor ...................... | 174/72 A |
| 4,353,518 | A | | 10/1982 | Taylor et al. | |
| 4,614,383 | A | | 9/1986 | Polley et al. | |
| 4,672,805 | A | | 6/1987 | Moritz | |
| 4,840,023 | A | | 6/1989 | Borsani | |
| 5,378,166 | A | * | 1/1995 | Gallagher, Sr. ............. | 439/214 |
| 5,443,312 | A | | 8/1995 | Schluter | |
| 5,765,698 | A | | 6/1998 | Bullivant | |
| 5,886,295 | A | * | 3/1999 | Carino et al. ............... | 174/481 |
| 5,893,539 | A | | 4/1999 | Tran et al. | |
| 5,921,402 | A | | 7/1999 | Magenheimer | |
| 6,070,742 | A | | 6/2000 | McAnally et al. | |
| 6,142,590 | A | | 11/2000 | Harwell | |
| 6,315,249 | B1 | | 11/2001 | Jensen et al. | |
| 6,327,139 | B1 | * | 12/2001 | Champion et al. .......... | 361/608 |
| 6,392,149 | B1 | | 5/2002 | Kim et al. | |
| 6,435,354 | B1 | | 8/2002 | Gray et al. | |
| 6,523,918 | B1 | | 2/2003 | Baiza | |
| 6,600,665 | B2 | | 7/2003 | Lauchner | |
| 6,805,248 | B2 | | 10/2004 | Champion et al. | |
| 6,856,505 | B1 | | 2/2005 | Venegas et al. | |
| 6,902,069 | B2 | | 6/2005 | Hartman et al. | |
| 6,972,949 | B1 | | 12/2005 | Helgenberg et al. | |
| 7,168,576 | B2 | * | 1/2007 | Williams ..................... | 211/26 |

* cited by examiner

*Primary Examiner*—Xuong Chung-Trans
(74) *Attorney, Agent, or Firm*—Mark W Handley

(57) ABSTRACT

A cable management arm (12) has elongate arms (22) and protuberances (26) which are spaced apart to define generally serpentine spaces (28) for passing cabling (44) to secure the cabling (44) within the cable management arm (12). The elongate arms (22) extend from lower portions (20) of the cable management arm (12), spaced apart from a vertical side (16) of the cable management arm (12). Upper portions (18) of the cable management arm (12) have edge recesses (24) formed therein to define the protuberances (26). A second cable management arm (102) has opposed cable retention members (138, 142) defined by generally serpentine slots (136) formed into tubular members (122) secured to elongate sections (104, 108) of the second cable management arm (102). The serpentine slots (136) define cable entry openings (144) for passing cabling (44) into the tubular members (122) to secure the cabling (44) to the cable management arms (102).

15 Claims, 3 Drawing Sheets

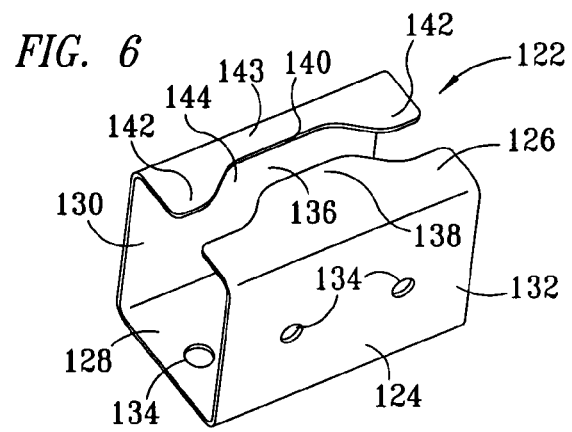
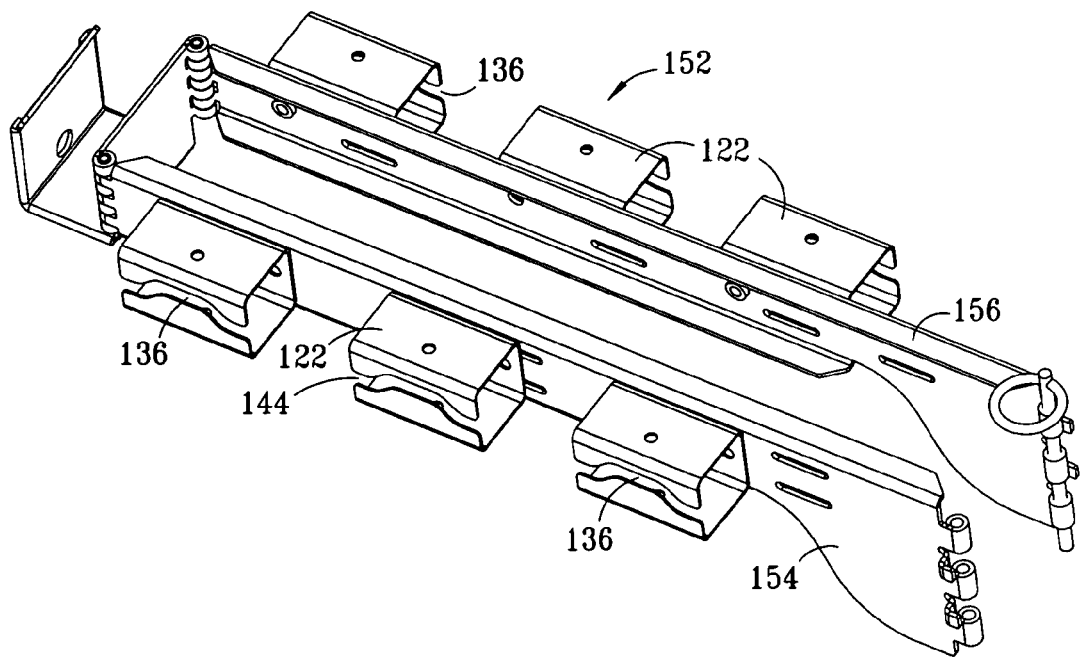

US 7,258,583 B1

CABLE MANAGEMENT ARM HAVING CABLE RETENTION MEMBERS

CROSS-REFERENCE TO RELATED APPLICATION

The present application claims priority as a continuation of U.S. Provisional Patent Ser. No. 60/648,528, filed Jan. 31, 2005, entitled "Cable Management Arm Having Cable Retention Members," and invented by Julian S. Baiza, a resident and a citizen of the United States of America.

TECHNICAL FIELD OF THE INVENTION

The present invention relates in general to cable management for securing cabling between drawers and cabinets, and in particular to a cable management arm having cable retention members.

BACKGROUND OF THE INVENTION

Cable management arms have been provided for securing cabling which connect between racks, or cabinets, and drawers which are extensible from within the racks. Typically, drawers, such as computer servers used in computer and telecommunication systems, are mounted within server racks by drawer slides such that the drawers are slidably extensible from within the server racks for installation, servicing and replacement. Cabling which connects between the drawers and the racks must be secured such that is does not become jammed between the drawers and the racks as drawers are extended and retracted relative to the racks. Cable management arms have been provided by elongate members which are pivotally connected together. Cabling has been secured to the cable management arms by straps, tie wraps and cabling brackets.

SUMMARY OF THE INVENTION

A novel cable management arm has opposed cable retention members which define a serpentine, or non-linearly extending space disposed between the opposed retention members. The opposed retention members include first and second retention members. The first retention member is preferably defined by at least one protuberant member. The second retention members are preferably defined by edge openings formed into edges of a surface disposed opposite the at least one protuberant member to define two spaced apart second retention members, which are protuberant members disposed adjacent to and spaced apart from the at least one protuberant member by the serpentine space for passing cabling there-between. The second retention members are preferably dispose on opposite sides of the first retention member. A lineal projection from the edges of the surface having the edge opening defining the second retention members is disposed in proximity to the at least one protuberant member defining the first protuberant member by a spacing which is preferably smaller than thicknesses of the cabling.

DESCRIPTION OF THE DRAWINGS

For a more complete understanding of the present invention and the advantages thereof, reference is now made to the following description taken in conjunction with the accompanying Drawings in which FIGS. 1 through 7 show various aspects for cable management arms having cable retention members devices made according to the present invention, as set forth below:

FIG. 1 is a perspective view of a first cable management arm ("CMA");

FIG. 2 is a top view of the first CMA;

FIG. 3 is sectional view of the first CMA, taken along Section Line 3-3 of FIG. 2;

FIG. 4 is a perspective view of a second CMA;

FIG. 5 is a perspective view of a third CMA;

FIG. 6 is a perspective view of a cable bracket used for the third CMA; and

FIG. 7 is a perspective view of a fourth CMA.

DETAILED DESCRIPTION OF THE INVENTION

Figure 1:
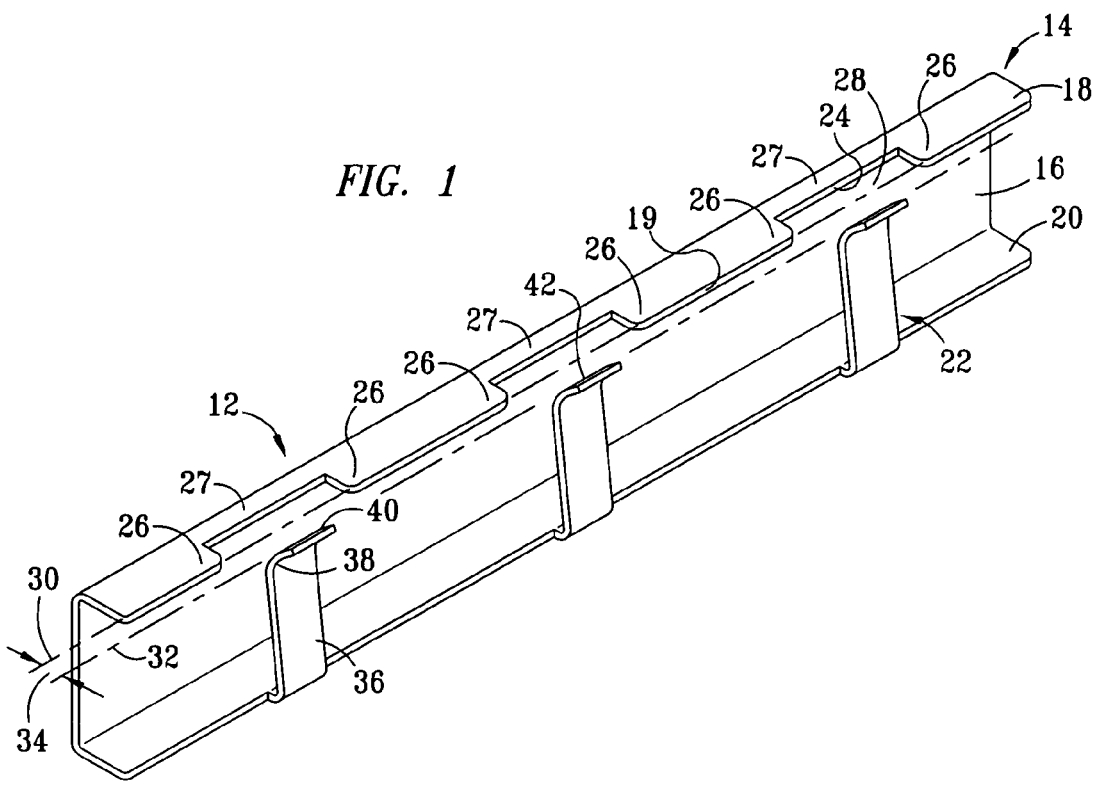

FIG. 1 is a perspective view of a first cable management arm ("CMA") 12. The CMA 12 has a body 14 defined to have a channel shape, with a vertical side 16, a top portion 18, and a bottom portion 20. The CMA 12 has opposed retention members 22 and 26 which are provided for retaining the cabling 44 (shown in FIG. 2) against the CMA 12. The first retention members 22 are preferably provided by protuberant members which extend upward from the bottom portion 20, spaced apart from the side 16 and the top portion 18. The top portion 18 provides the second retention members 26. The top portion 18 has peripheral edges 19 into which edge openings 24 are formed to define an open space 28 between an inward end of the retention member 22 and the periphery of the top portion 18 at the edge opening 24. The second retention members 26 are defined on opposite ends of the edge opening 24, and define protuberances, or protuberant members, providing protuberant portions which protrude on opposite ends of respective ones of the retention members 22. A retention member 27 is also defined by the edge opening 24 extending into the top portion 18, extending between the two retention members 26. The retention members 22 and 26 are disposed in an adjacent, spaced apart relation to define the space 28 of such size that the cables 44 will easily pass between the retention members 22 and 26.

The space 28 is preferably of serpentine shape, that is, non-lineal, or not straight, such that the cabling must be snaked in-between the peripheral edge 19 of the top portion 18, the retention members 26 and the retention member 22 to fit through the space 28. By snaked, reference is made to bending the cabling 44 (shown in FIG. 2) such that it is not strait, or in other words, not lineally extending. A line 30 projected from the outermost peripheral edge 19 of the top portion 18 is shown in FIG. 1. Also shown is a projected line 32 from the inward-most portion of the retention members 22. The projected lines 30 and 32 are preferably spaced apart by a minimal clearance 34, such that the thickness of the cables 44 (shown in FIG. 2) being inserted within the CMA 12 will not pass through the minimal clearance 34. However, the space 28 between the first retention member 22 and the second retention members 26, which are defined by the edge periphery 19 of the top portion 18 at the edge openings 24, is such that the cabling 44 will easily pass there-through. The first retention members 22 have a main body portion 36, an end portion 38 and an outer portion 40. The outer portion 40 extends outward and away from the side 16 to provide an entry guide surface 42. The first retention member 22 is shown extending from the bottom portion 20 upward towards the top portion 18 providing the clearance or space 28 between the inward end portion of the first retention member 22 and the peripheral edge of the top portion 18 at the edge opening 24 adjacent the second retention members 26.

Figure 2:
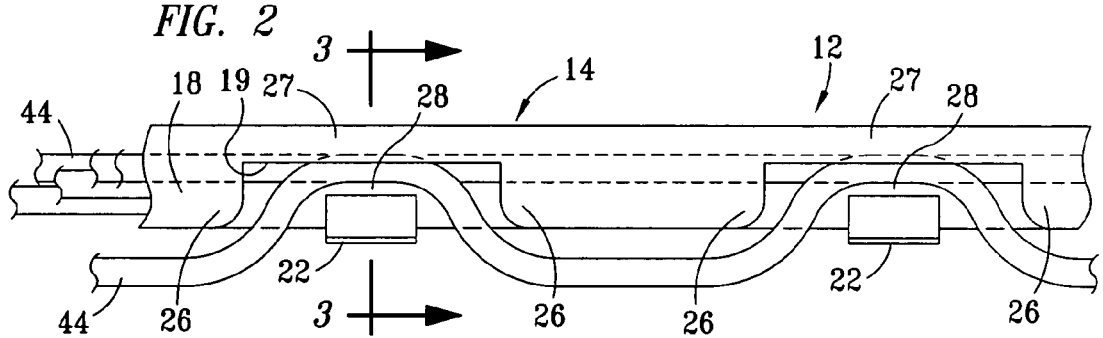
Figure 3:
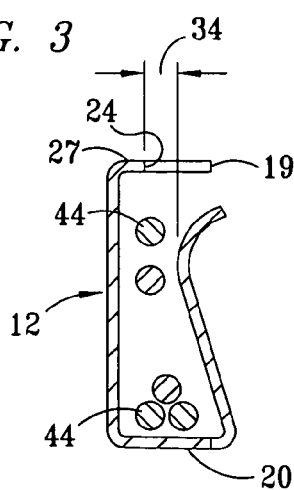

FIG. 2 is a top view of the CMA 12, and FIG. 3 is sectional view of the CMA 12, taken along Section Line 3-3 of FIG. 3. FIGS. 2 and 3 show a plurality of cables 44 after being inserted within the CMA 12, with one of the cables 44 being shown as it is being snaked through the cable entry opening 28. The CMA 12 is provided for retaining cables, or cabling 44, and is typically used for drawers, or chassis, housing server systems in equipment racks, or cabinets, to retain cables connecting between drawers which are slidably extensible from within from the equipment racks. The cabling must be snaked in-between the peripheral edge 19 of the top portion 18, the retention members 26 defined thereon, and the retention members 22 to fit within and to be removed from within the cable management arm 12.

Figure 4:
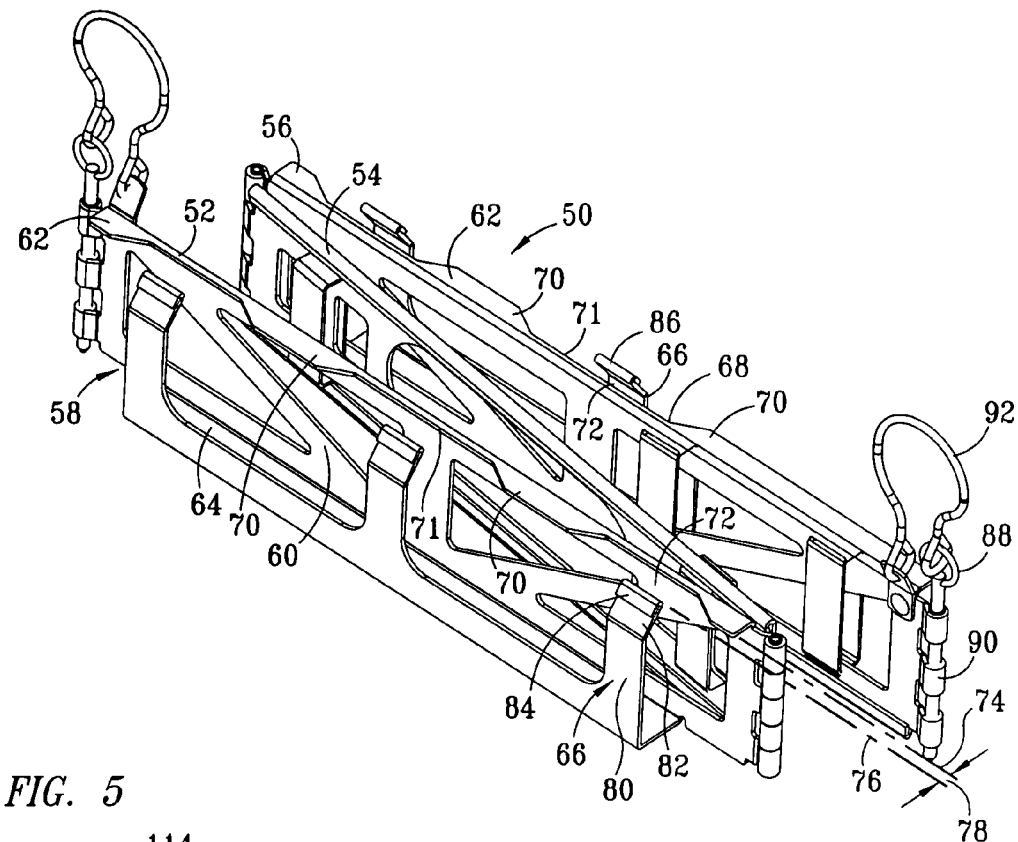

FIG. 4 is a perspective view of a second CMA 50. The second CMA 50 is a three-part cable management arm having a section 52, a section 54 and a section 56 which are pivotally linked together, such as is well known in the art. Each of the sections 52, 54 and 56 has a body 58, which is preferably formed from a single unitary sheet of metal to define an integrally formed structure. The body 58 is preferably U-shaped, having a side 60, a top portion 62 and a bottom portion 64. First and second opposed, cable retention members 66 and 70 are provided for securing cabling to the CMA 50. The first retention members 66 are preferably protuberances, or protuberant members, provided by elongate fingers which extend upward from the bottom portion 64. The second retention members 70 are preferably provided by the top portion 62 into which edge openings 68 are formed to extend, adjacent to the retention members 66, such that the edges of the top portions 62 define opposed retention members 70 which are protuberances, or protuberant members, providing protuberant portions that are spaced apart from the first retention member 66. Retention members 71 are disposed adjacent to respective ones of the edge openings 68 and between the second retention members 66. The edge openings 68 formed into the edges of the top portions 62 define a peripheries of the second retention members 70 and 71, of the top portions 62, which are spaced apart from the retention member 66 to provide a space 72 for passing cables there-between.

A line 74 projected from an outward, peripheral edge of the top portion 62 is spaced apart from a line 76 projected from an inward end portion of the retention members 66 by a minimal clearance 78, which preferably the cabling will not pass through. The space 72 is preferably serpentine, that is, non-lineal, or not straight, such that the cabling must be snaked between the edge of the retention member 66 and the retention members 70 and 71 to fit through the space 72. By snaked, reference is made to bending the cabling such that it is not strait, or in other words, not lineally extending. The retention members 66 have a main body 80, an end portion 82 and an outer portion 84. An entry guide surface 86 is provided by an inward most end of the outer portion 84, preferably on the terminal end of the retention members 66 as shown in FIG. 4. Coupling pins 88 are provided for fitting in hinge loops 90 on opposite ends of the CMA 50 for securing the CMA 50 to a cabinet, or a server rack, and a drawer, such a computer chassis, which is removable from within the cabinet. The sides 60 of the sections 52, 54 and 56 are defined by web portions, such that there are openings within each of the sides 60.

Figure 5:
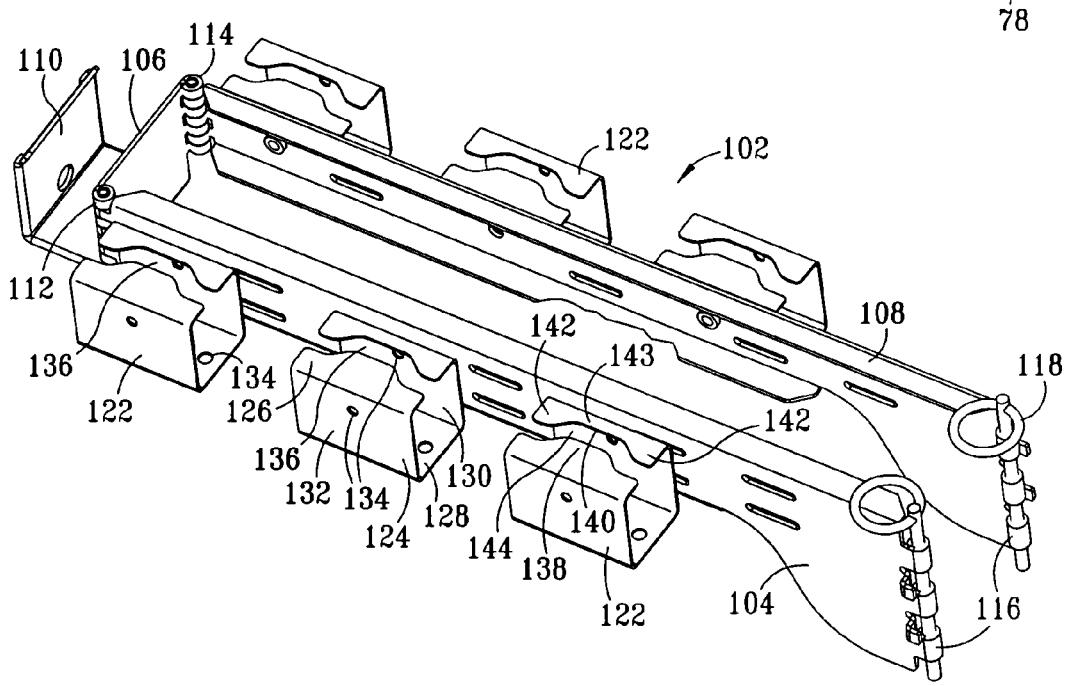

FIG. 5 is a perspective view of a third CMA 102. The CMA 102 is defined by three sections 104, 106 and 108 which are pivotally connected together by hinges 112 and 114. Opposite ends of the CMA 102 have hinge loops 116 for receiving fast pins 118 for securing the CMA 102 to a cabinet or rack and to a drawer chassis, with the drawer chassis being extendable from within the cabinet or rack. The section 106 is an intermediate section which provides an end bracket 110 through which the cables are passed when inserted within the CMA 102. Cable brackets 122 are mounted to outward sides of the CMA section 104 and the CMA section 108. The cable brackets 122 are generally tubular bodies 124 shown as having a rectangular shape with four sides, defined by a top side 126, a bottom side 128, an inward side 130 and an outward side 132. Mounting apertures 134 are provided in the bottom side 128, the inward side 130 and the outward side 132 of the cable brackets 122 for mounting the cable brackets 122 to various ones of the sections 104 and 108. Slots 136 are formed in the top side 126 of the cable brackets 122 for providing a cable entry opening 144 for receiving various cables to be retained by the CMA 102. The slots 136 are preferably non linear, of a generally serpentine shape, and extend the full length of the top side 126 of the cable brackets 122, to define first retention members 138 and edge openings 140.

The edge openings 140 extend into the edge periphery of the top 126 between respective ones of second retention members 142 and adjacent retention members 143, to define the second retention members 142 and the retention member 143. The first retention members 138 are spaced apart from respective, opposed ones of the second retention members 142 and the retention members 143 to define the serpentine-shaped slot 136 which is part of the cable entry opening 144 through which the cables may be passed. Preferably, the cables must be snaked, or shaped from lineal extension, to fit within the cable entry openings 144 for passing into the cable brackets 122. Then, the retention members 138, and the retention members 142 and 143 of the top 126 will prevent the cables from being removed from within the cable brackets 122 as long as the cables are extending linearly, and not moved back into a serpentine shape.

FIG. 6 is a perspective view of one of the cable brackets 122 described above, showing the cable bracket 122 in more detail.

FIG. 7 is a perspective view of a fourth CMA 152. Hinge loops 166 are provided on the opposite ends of the third CMA 152 for mounting the forth CMA 152 to one end to a server rack and the other end to a drawer or chassis, and fast pins 168 are provided for fitting within the hinge loops 166 and mating hinge loops mounted to the cabinet, or rack, and the drawer. The cable brackets 122 are mounted to the sections 154 and 156 of the fourth CMA 152, except that the slots 136 defining the generally serpentine-shaped cable entry openings 144 are aligned to be on the outward ends of the cable brackets 122, disposed on opposite sides of the cable brackets 122 from the respective sides of sections 154 and 156 of the CMA 152 to which they are attached, and extending parallel to the respective sides of the sections of the CMA 152. Thus, cables will be inserted through the outward sides of the cable brackets 122 as mounted to the fourth CMA 152, rather than cabling passing through the upwardly disposed, top sides of the cable brackets 122 of the CMA 102, as shown in FIG. 5.

Thus the advantages of this invention provide a cable management arm having opposed cable retention members, such that cabling may only be removed from the cable management arm by snaking the cabling through a serpentine cable entry opening disposed between the cable retention members. That is, lineally extending cables which are included as part of the cabling secured by the retention members of the cable management arm preferably have a thickness of a size which will not pass through the cable openings when pulled straight.

Although the preferred embodiment has been described in detail, it should be understood that various changes, substitutions and alterations can be made therein without departing from the spirit and scope of the invention as defined by the appended claims.

What is claimed is:

1. A cable management arm having sections which are coupled together for moveably extending and retracting with cabling secured thereto, said cable management arm comprising:
   a first one of said sections having a body with a first portion and a second portion, wherein said first and second portions are spaced apart and extend generally in directions along a length of said body;
   a first protuberant member extending from said first portion of said body to a position proximate said second portion of said body, spaced apart from said second portion of said body for receiving cabling there-between;
   said second portion of said body having a recess formed therein to define protuberant portions disposed on opposite sides of said recess, with said recess spaced apart in opposed relation to said first protuberant member and said protuberant portions spaced apart from opposite sides of said first protuberant member;
   wherein said recess and said protuberant portions are spaced part from said first protuberant member to define a cable entry opening there-between; and
   wherein said cable entry opening is non-linear, such that the cabling must be snaked-in to pass between said protuberant member and said protuberant portions for passing said cabling through said cable entry opening.

2. The cable management arm according to claim 1, wherein said second portion of said body defines an edge of said body, and said protuberant portions are edge portions which are defined by said recess being formed into said edge.

3. The cable management arm according to claim 2, wherein said body is defined by said first one of said sections, being integrally formed therewith, and said first retention member is defined by an elongate, finger-like member which extends from a lower portion of said first one of said sections defining said body and extends spaced apart from a side of said body to define a space for receiving said cabling.

4. The cable management arm according to claim 2, wherein said body is defined by a tubular member which is fastened to said first one of said sections, and said cable entry opening is defined by a slot formed into one side of said tubular member to define said recess, said protuberant portions and said at least one protuberant member from said body.

5. The cable management arm according to claim 4, wherein said slot defining said cable entry opening is of a generally serpentine shape and extends for a complete length of said tubular member.

6. The cable management arm according to claim 5, wherein said tubular member has a rectangular shape.

7. A cable management arm, comprising:
   first and second elongate sections which are pivotally coupled together for moveably extending and retracting with cabling secured thereto;
   said first and second elongate sections each having first and second portions which extend in directions along respective lengths of said first and second elongate sections;
   said first portions of respective ones of said first and second elongate sections formed to define protuberant members, with ends of said protuberant members spaced apart from respective second portions of said first and second elongate sections;
   said second portions of respective ones of said first and second elongate sections having edges which are formed to define protuberances and recesses extending in spaced apart relation to respective ones of said protuberant members of said first portions to define respective cable entry openings there-between; and
   wherein said cable entry openings are non-linear, such that the cabling must be snaked-in to pass between respective ones of said protuberant members and said protuberant portions for passing through said cable entry openings.

8. The cable management arm according to claim 7, wherein said first and second portions are integrally formed of said first and second elongate sections, and said protuberant members are defined by elongate, finger-like members which extend from lower portions of respective ones of said elongate sections, spaced apart from sides of respective ones of said first and second elongate sections for receiving said cabling from said cable entry openings.

9. The cable management arm according to claim 7, wherein said first and second portions are defined by tubular members which are fastened to respective ones of said first and second elongate sections, and said cable entry openings are defined by slots formed into respective sides of said tubular members, said slots defining respective ones of said recesses, said protuberant portions and said protuberant members, with one of said slots defining one of said cable entry openings in each of said tubular members.

10. The cable management arm according to claim 9, wherein said slots defining said respective ones of said cable entry openings are generally serpentine in shape and extend for complete lengths of respective ones of said tubular members.

11. The cable management arm according to claim 10, wherein said tubular member are rectangular in shape.

12. A cable management arm, comprising:
   first and second elongate sections which are pivotally coupled together for moveably extending and retracting with cabling secured thereto;
   said first and second elongate sections each having first and second portions which extend in directions along respective lengths of said first and second elongate sections;
   said first portions of respective ones of said first and sections elongate sections formed to define protuberant members, with ends of said protuberant members spaced apart from respective second portions of said first and second elongate sections;
   said second portions of respective ones of said first and second elongate sections having edges which are formed to define protuberances and recesses extending in spaced apart relation to respective ones of said protuberant members of said first portions to define respective cable entry openings there-between; and
   wherein said cable entry openings are of a generally serpentine shape, such that the cabling must be snaked-in to pass between respective ones of said protuberant members and said protuberant portions for passing through said cable entry openings.

13. The cable management arm according to claim 12, wherein said first and second portions are integrally formed of said first and second elongate sections, and said protuberant members are defined by elongate, finger-like members which extend from lower portions of respective ones of said elongate sections, spaced apart from sides of respective ones of said first and second elongate sections for receiving said cabling from said cable entry openings.

14. The cable management arm according to claim 12, wherein said first and second portions are defined by tubular members which are fastened to respective ones of said first and second elongate sections, and said cable entry openings are defined by slots formed into respective sides of said tubular members, said slots defining respective ones of said recesses, said protuberant portions and said protuberant members, with one of said slots defining one of said cable entry openings in each of said tubular members.

15. The cable management arm according to claim 14, wherein said tubular member are rectangular in shape, and said slots define said generally serpentine shape of said cable entry openings and extend for complete lengths of respective ones of said tubular members.

* * * * *